United States Patent
Shuler, Jr.

(10) Patent No.: US 6,943,619 B1
(45) Date of Patent: Sep. 13, 2005

(54) PRACTICAL ACTIVE CAPACITOR FILTER

(75) Inventor: Robert L. Shuler, Jr., Friendswood, TX (US)

(73) Assignee: The United States of America as represented by the Administrator of the National Aeronautics and Space Administration, Washington, DC (US)

(*) Notice: Subject to any disclaimer, the term of this patent is extended or adjusted under 35 U.S.C. 154(b) by 0 days.

(21) Appl. No.: 10/443,233

(22) Filed: May 21, 2003

(51) Int. Cl.⁷ .................................. H03K 5/00
(52) U.S. Cl. ............... 327/554; 327/553; 333/80 R
(58) Field of Search ..................... 327/552–559, 327/308; 333/80 R, 125; 330/103, 294

(56) References Cited

U.S. PATENT DOCUMENTS

| | | | |
|---|---|---|---|
| 3,621,407 A | 11/1971 | Low et al. .................. 327/525 |
| 3,831,117 A * | 8/1974 | Fletcher et al. ............. 330/302 |
| 4,100,515 A | 7/1978 | Gupta | |
| 4,339,729 A * | 7/1982 | Jason et al. ................. 330/294 |
| 4,383,230 A | 5/1983 | Manzolini ................... 333/214 |
| 4,764,938 A | 8/1988 | Meyer ........................ 375/232 |
| 5,182,522 A | 1/1993 | Tanigawa et al. ........... 327/552 |
| 5,216,375 A | 6/1993 | Tanigawa et al. ........... 327/335 |
| 5,235,223 A * | 8/1993 | Maple ........................ 327/556 |
| 5,327,027 A | 7/1994 | Taylor ........................ 327/524 |
| 5,652,537 A * | 7/1997 | Fleeman ..................... 327/358 |
| 5,914,633 A | 6/1999 | Comino et al. ............. 327/553 |
| 6,052,025 A * | 4/2000 | Chang et al. ............... 330/253 |
| 6,232,832 B1 | 5/2001 | Kirkpatrick, II ............ 327/560 |
| 6,437,615 B1 * | 8/2002 | Stascausky ................. 327/156 |
| 2001/0038309 A1 | 11/2001 | Hagemeyer | |
| 2003/0006809 A1 * | 1/2003 | Enriquez ..................... 327/100 |

* cited by examiner

*Primary Examiner*—Dinh T. Le
(74) *Attorney, Agent, or Firm*—Theodore U. Ro (57) ABSTRACT

A method and apparatus is described that filters an electrical signal. The filtering uses a capacitor multiplier circuit where the capacitor multiplier circuit uses at least one amplifier circuit and at least one capacitor. A filtered electrical signal results from a direct connection from an output of the at least one amplifier circuit.

11 Claims, 5 Drawing Sheets

PRACTICAL ACTIVE CAPACITOR FILTER

ORIGIN OF THE INVENTION

The invention described herein was made by employee(s) of the United States Government and may be manufactured and used by or for the Government of the United States of America for governmental purposes without the payment of any royalties thereon or therefor.

BACKGROUND OF INVENTION

In many circuits, a relatively large valued capacitor is desired. However, to manufacture the relatively large valued capacitor in, and on, an integrated circuit (or chip), normally requires that an unduly large portion of the available area of the integrated circuit be devoted to the capacitor. Accordingly, relatively large valued capacitors may be required to be connected externally to the integrated circuit. Externally connecting components (e.g., a capacitor) to the integrated circuit may present several problems including, but not limited to, decreased reliability, increased signal noise, and worse matching between components.

Figure 1:
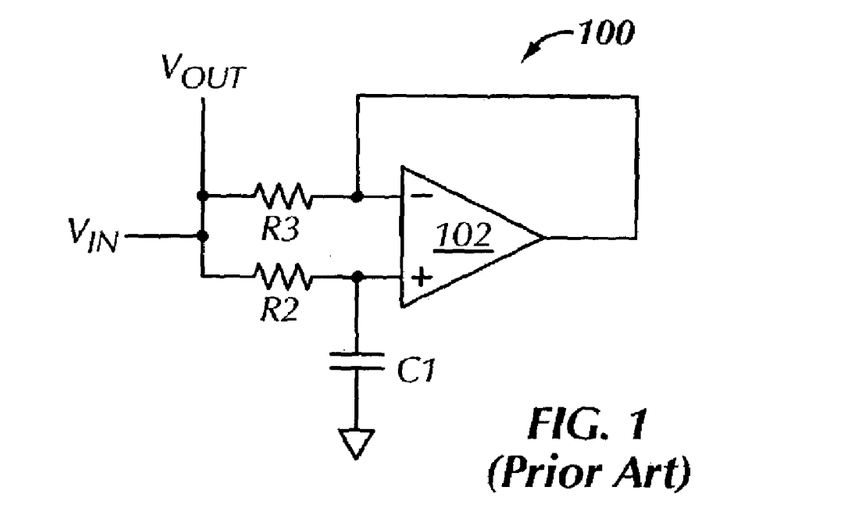
FIG. 1 shows a schematic diagram of a typical capacitor multiplier circuit.

One approach to the problem of insufficient on-chip capacitance may include the use of a known capacitance multiplication circuit (100) as shown in FIG. 1. The capacitance multiplication circuit (100) includes an amplifier circuit (102) and a resistor R2 connected between a node of the amplifier circuit (102) and VIN. A capacitor C1 is connected between the node and a reference voltage potential, in this example, a ground voltage potential. The amplifier circuit (102) is arranged as a unity gain amplifier. Another resistor R3 connects between a another node of the amplifier circuit (102) and VOUT. The amplifier circuit (102) ensures that the voltage drop across the resistor R3 is equal to the voltage drop across the resistor R2. The effective capacitance of the capacitance multiplication circuit (100) is equal to C1 times (R2+R3)/R3. Thus, by making R2 larger than R3, the effective capacitance is much large than the capacitance of C1.

SUMMARY OF INVENTION

According to one aspect of one or more embodiments of the present invention, the present invention relates to an electrical signal filter circuit comprising an input signal line; an output signal line; a resistor where the resistor is operatively connected between the input signal line and a node; and a capacitor multiplier circuit where the capacitor multiplier circuit is operatively connected to the node where the capacitor multiplier circuit comprises at least one amplifier circuit and at least one capacitor where the output signal line is directly connected to an output of the at least one amplifier circuit and where the capacitor multiplier circuit increases a capacitance of a received signal.

According to one aspect of one or more embodiments of the present invention, the present invention relates to an electrical signal filter circuit comprising an input signal line; an output signal line; a resistor where the resistor is operatively connected between the input signal line and a node; and a capacitor multiplier circuit where the capacitor multiplier circuit is operatively connected to the node and the output signal line where the capacitor multiplier circuit comprises a first differential amplifier circuit, a second differential amplifier circuit, and at least one capacitor and where the at least one capacitor operatively connects between at least one input terminal of at least one selected from the first differential amplifier circuit and the second differential amplifier circuit and a reference voltage potential.

According to one aspect of one or more embodiments of the present invention, the present invention relates to a method for filtering an electrical signal comprising inputting the electrical signal; filtering the electrical signal where the filtering uses a capacitor multiplier circuit and where the capacitor multiplier circuit comprises at least one amplifier circuit and at least one capacitor; and outputting a filtered electrical signal where the outputting results directly from an output of the at least one amplifier circuit.

According to one aspect of one or more embodiments of the present invention, the present invention relates to an electrical signal filter circuit comprising means for inputting an electrical signal; means for filtering the electrical signal where the means for filtering uses a capacitor multiplier circuit and where the capacitor multiplier circuit comprises at least one amplifier circuit and at least one capacitor; and means for outputting a filtered electrical signal where the means for outputting results directly from an output of the at least one amplifier circuit.

Other aspects and advantages of the invention will be apparent from the following description and the appended claims.

DETAILED DESCRIPTION

In the following detailed description of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

Embodiments of the present invention relate to an electrical signal filter circuit. The electrical signal filter circuit includes a capacitor multiplier circuit where the capacitor multiplier circuit includes an amplifier circuit and a capacitor. In one or more embodiments, an output of the amplifier circuit is directly used as the output of the capacitor multiplier circuit. In one or more embodiments, the amplifier circuit includes a p-type differential amplifier circuit and an n-type differential amplifier circuit. In one or more embodiments, the capacitor is selectively disconnected from the capacitor multiplier circuit to calibrate an offset voltage potential of the amplifier circuit.

Figure 2:
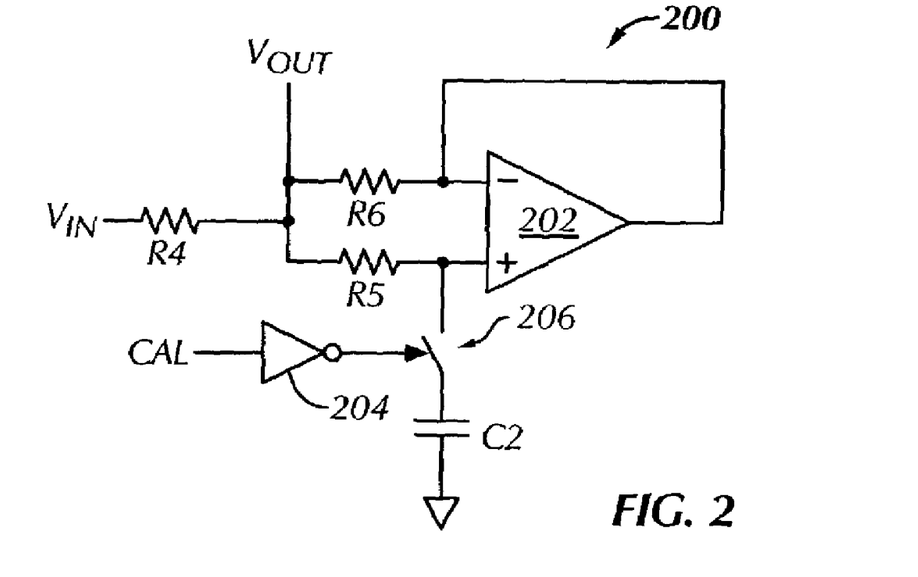
FIG. 2 shows a schematic diagram of an electrical signal filter circuit in accordance with an embodiment of the present invention.

FIG. 2 shows a schematic diagram of an electrical signal filter circuit (200) in accordance with an embodiment of the present invention. The electrical signal filter circuit (200) includes a resistor R4 and a capacitor multiplier circuit. The capacitor multiplier circuit includes an amplifier circuit (202) and a capacitor C2. The amplifier circuit (202) is arranged as a unity gain amplifier circuit. The capacitor C2 is operatively connected between an input of the amplifier circuit (202) and a reference voltage potential, for example, a ground voltage potential. The electrical signal filter circuit (200) forms an electrical signal filter circuit by creating a resistor-capacitor (i.e., RC) filter.

A DC static analysis of the electrical signal filter circuit (200), assuming an idealized amplifier circuit (202), shows that a transfer function is $$V_{OUT} = V_{IN} + (V_6 - V_5)\left(\frac{R4}{R6}\right) \quad (1)$$

where $V_{OUT}$ and $V_{IN}$ are the voltage potentials at the nodes shown in FIG. 2, $V_6$ and $V_5$ are voltage potentials that correspond to the negative and positive terminals of the amplifier circuit (202), respectively, and R4 and R6 are the resistances shown in FIG. 2. In Equation 1, an offset voltage potential of the amplifier circuit (202) is ($V_6-V_5$). Accordingly, any imperfections or variations in the offset voltage potential of the amplifier circuit (202) over a common mode range are amplified and included in the signal at VOUT.

In one or more embodiments, a method and apparatus to remove or reduce an offset voltage potential of the amplifier circuit (202) is provided. The capacitance multiplication circuit (200) uses a switch (206) to selectively disconnect the capacitor C2 from the amplifier circuit (202). The switch (206) may be user controlled and is connected to a calibration signal CAL through an inverter (204). When the calibration signal CAL is at, for example, a low voltage potential, the switch (206) is closed. Accordingly, the capacitance multiplication circuit (200) operates normally. When the calibration signal CAL is at, for example, a high voltage potential, the switch (206) is open.

In order to determine an offset voltage potential error, the calibration signal CAL is set to open the switch (206), and other switches (not shown) zero the input voltage potential of any preceding amplifier stages. A final output, V0, of a signal amplifier chain is read and saved as a zero reference point for the signal amplifier chain. The final output, V0, may be converted to a digital value by a digital-to-analog converter. The signal amplifier chain may be returned to a normal operating mode by closing the switch (206). An offset voltage potential free output can be obtained by subtracting the final output, V0, from a output signal measured from the signal amplifier chain.

A calibration cycle may be repeated as necessary to provide correction for drifts with temperature. However, calibration may not need to be repeated continuously as in a chopper, ping-pong, or auto-zero system. The calibration signal CAL may be arranged to open the switch (206) using either a high voltage potential or a low voltage potential.

The switch (206) preserves the state of the capacitor C2 during the calibration cycle. Also, by removing the capacitor C2 during the calibration cycle, the time the calibration cycle takes is reduced. The time for calibration cycle may include both a time required for the capacitance multiplication circuit (200) to settle during calibration and a time required to recover after calibration.

Many different amplifier circuit designs are known in the art. With an amplifier circuit that uses a p-type input field effect transistor pair, performance degrades abruptly as an input common mode voltage potential approaches a high side supply voltage potential. Also, with an amplifier circuit that uses an n-type input field effect transistor pair, performance degrades abruptly as an input common mode voltage potential approaches a low side supply voltage potential.

Undesirable operation may occur as an output voltage potential is fed back to input terminals of an amplifier circuit if the output voltage potential is near a supply voltage potential. Accordingly, the amplifier circuit may become locked in a non-performing state until the input voltage potential on the input terminals of the amplifier circuit moves far enough away from the supply voltage potential to break the lock. The undesirable operation is amplified in a capacitor multiplier circuit because of a positive feedback path from the amplifier circuit output to a positive node of the amplifier circuit through resistors R2 and R3 (as shown in FIG. 1). Accordingly, the amplifier circuit may remain locked over most of the amplifier circuit input voltage potential range. Even if the amplifier circuit does not become locked, the output voltage potential may become greatly distorted in a non-performing region because some amplifier circuit imperfections are multiplied in the circuit configuration shown in FIG. 1.

Many amplifier circuit designs have been developed to provide an extended common mode range, usually using a combination of n-type input and p-type input field effect transistor pairs. Amplifier circuit designs with extended common mode range may combine currents produced from the n-type input and the p-type input field effect transistor pairs to form a single output and a means of smoothing a transition between the two n-type input and p-type input regions of operation. However, typical amplifier circuit designs are not usually suitable for use in a capacitor multiplier circuit because the n-type input and p-type input field effect transistor pairs may have inherently different offset voltage potentials. As an amplifier circuit transitions from greater dependence on the n-input field effect transistor pairs to the p-type input field effect transistor pairs, or vice-versa, an offset voltage potential may change dramatically.

Figure 3:
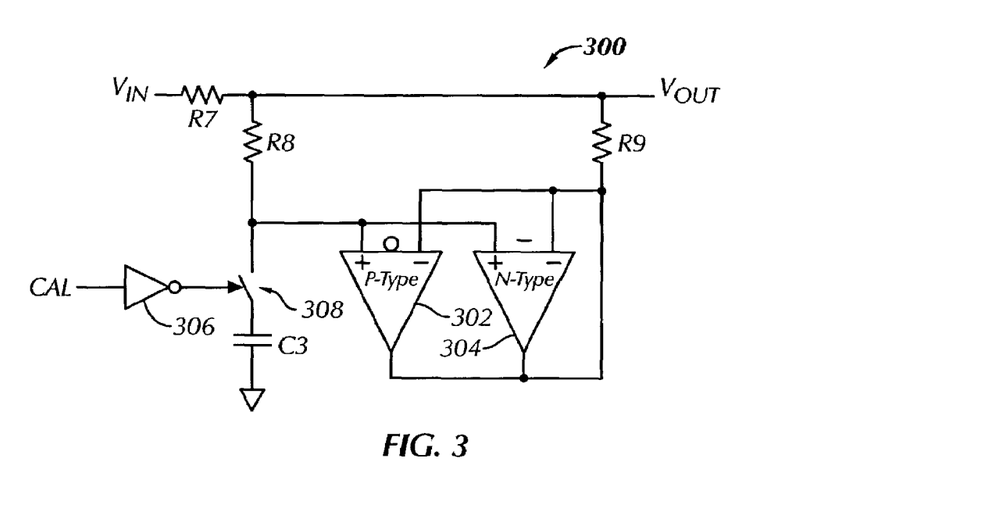
FIG. 3 shows a schematic diagram of an electrical signal filter circuit using p-type and n-type differential amplifier circuits in accordance with an embodiment of the present invention.

FIG. 3 shows a schematic diagram of an electrical signal filter circuit (300) using a p-type differential amplifier circuit (302) and an n-type differential amplifier circuit (304) in accordance with an embodiment of the present invention. Instead of a capacitor multiplier circuit combining p-type and n-type derived signals into a single output from a single amplifier circuit, two complete differential amplifier circuits, each operating over a maximum input voltage potential range, are used. For example, the p-type differential amplifier circuit (302) and the n-type differential amplifier circuit (304) are each complete amplifier circuits. The capacitor C3 is operatively connected between an input of both the p-type differential amplifier circuit (302) and the n-type differential amplifier circuit (304) and a reference voltage potential, for example, a ground voltage potential.

Accordingly, over a majority of a common mode range the offset voltage potential of the p-type differential amplifier circuit (302) and the n-type differential amplifier circuit (304) is averaged and may not have any significant transitions when switching between an output voltage potential dominated by either the p-type differential amplifier circuit (302) or the n-type differential amplifier circuit (304). One of ordinary skill in the art will understand that both the p-type differential amplifier circuit (302) and the n-type differential amplifier circuit (304) should be designed for minimal variation of offset voltage potential over usable ranges.

As an input common mode range approaches one side of a supply voltage potential, a quality of an output voltage potential of an amplifier circuit will invariably deteriorate. However, the quality deterioration of the output voltage potential of the amplifier circuit does not occur in the middle of the range where the most accurate measurements are usually desired.

Furthermore, the capacitor multiplier circuit shown in FIG. 3 eliminates a tendency of the capacitor multiplier circuit to become locked. As one differential amplifier circuit (302 or 304) begins to enter a non-performing region, the other differential amplifier circuit (304 or 302, respectively) remains in a performing region. Also, as an input voltage potential moves into a performing region for both the p-type differential amplifier circuit (302) and the n-type differential amplifier circuit (304), one differential amplifier circuit (302 or 304) nudges the other differential amplifier circuit (304 or 302, respectively) out of the locked region.

The combined p-type differential amplifier circuit (302) and the n-type differential amplifier circuit (304) are arranged as a unity gain amplifier circuit. The electrical signal filter circuit (300) uses a switch (308) to selectively disconnect the capacitor C3 from the capacitance multiplication circuit. The switch (308) may be user controlled and is connected to a calibration signal CAL through an inverter (306). When the calibration signal CAL is at, for example, a low voltage potential, the switch (308) is closed. Accordingly, the electrical signal filter circuit (300) operates normally. When the calibration signal CAL is at, for example, a high voltage potential, the switch (308) is open, and the electrical signal filter circuit (300) may be calibrated.

Figure 4:
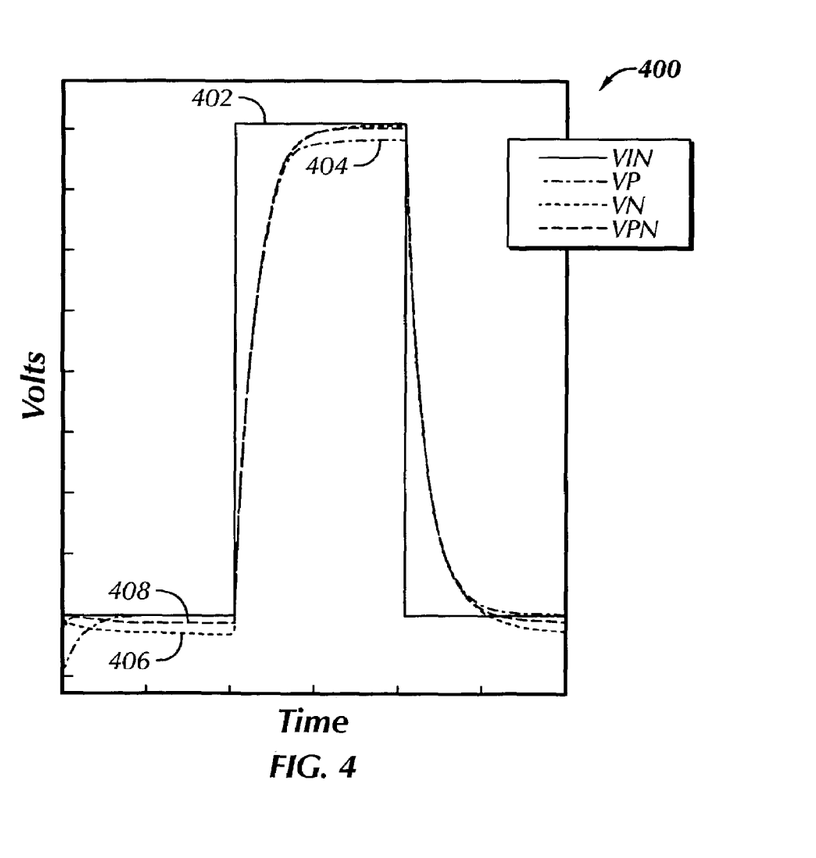
FIG. 4 shows a graph in accordance with an embodiment of the present invention.

FIG. 4 shows a graph (400) in accordance with an embodiment of the present invention. The graph (400) shows a curve (402) of an input voltage potential. A response from a p-type differential amplifier circuit, e.g., p-type differential amplifier circuit (302) shown in FIG. 3, is illustrated in curve (404). A response from an n-type differential amplifier circuit, e.g., n-type differential amplifier circuit (304) shown in FIG. 3, is illustrated in curve (406). A response from a combined p-type differential amplifier circuit and n-type differential amplifier circuit, e.g., the combined p-type differential amplifier circuit (302) and n-type differential amplifier circuit (304) of the electrical signal filter circuit (300) shown in FIG. 3, is illustrated in curve (408).

The curve (408) is averaged from the curves (404, 406). Also, curve (408) does not show any significant transitions when switching between an output voltage potential dominated by either the p-type differential amplifier circuit or n-type differential amplifier circuit.

Figure 5:
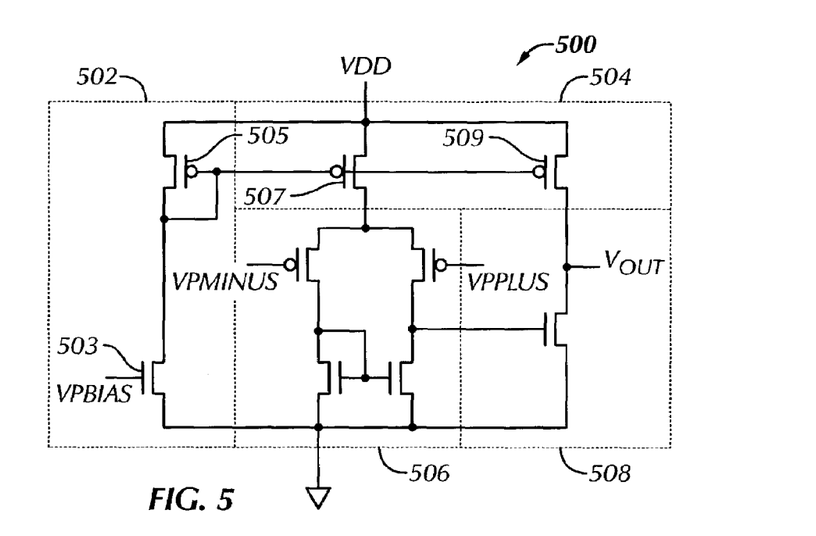
FIG. 5 shows a schematic diagram of a p-type differential amplifier circuit in accordance with an embodiment of the present invention.

FIG. 5 shows a schematic diagram of a p-type differential amplifier circuit (500) in accordance with an embodiment of the present invention. The p-type differential amplifier circuit (500) includes a bias circuit (502) that controls a bias of a current source (504). The p-type differential amplifier circuit (500) also includes a differential amplifier (506) and an output circuit (508).

The bias circuit (502) has an input voltage potential VPBIAS that controls a current through an n-channel transistor (503) connected to a p-channel transistor (505) arranged as a diode. The bias condition of the bias circuit (502) is mirrored in the p-channel transistors (507, 509) in the current source (504). The differential amplifier (506) amplifies a difference between input voltage potentials VPMINUS and VPPLUS. A resulting voltage potential from the differential amplifier (506) is amplified by the output circuit (508).

Figure 6:
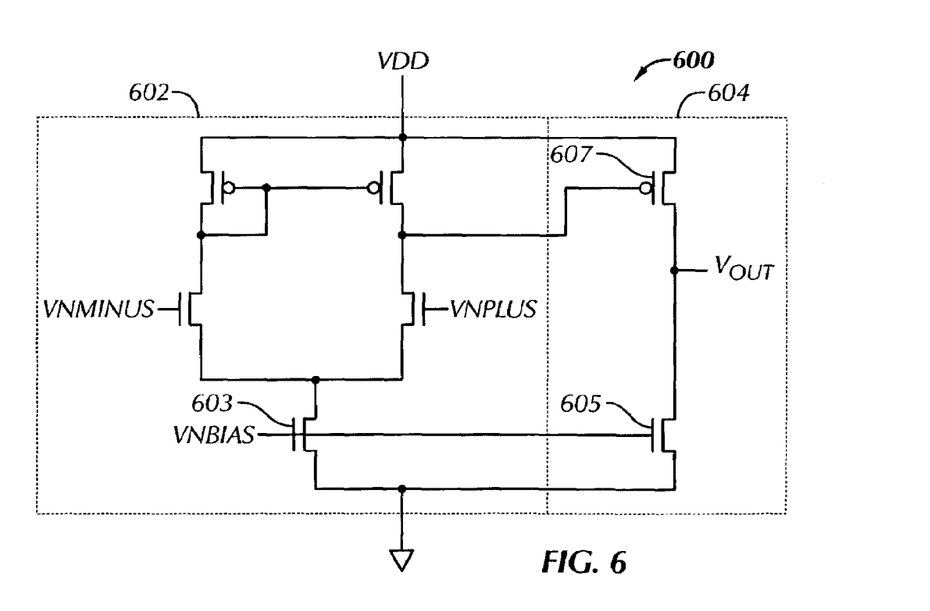
FIG. 6 shows a schematic diagram of an n-type differential amplifier circuit in accordance with an embodiment of the present invention.

FIG. 6 shows a schematic diagram of an n-type differential amplifier circuit (600) in accordance with an embodiment of the present invention. The n-type differential amplifier circuit (600) includes a differential amplifier (602) and an output circuit (604).

The differential amplifier (602) amplifies a difference between input voltage potentials VNMINUS and VNPLUS. An amplitude of a voltage potential of a resulting difference signal is controlled by an input voltage potential VNBIAS that controls a bias through an n-channel transistor (603). A resulting voltage potential from the differential amplifier (602) is amplified by the output circuit (604). The input voltage potential VNBIAS also controls a bias of an n-channel transistor (605). A p-channel transistor (607) amplifies a resulting voltage potential from the differential amplifier (602).

In FIG. 1, when the capacitor multiplier circuit (100) is used purely as a capacitor multiplier circuit, an input signal at VIN and an output signal at VOUT are connected as labeled. If the capacitor multiplier circuit (100) is used as an electrical signal filter, and not solely as a capacitor multiplier circuit (100), the output signal at VOUT may be connected as shown in FIG. 1, connected to the plus terminal of the amplifier circuit (102), or connected to the output of the amplifier circuit (102). Theoretically, all three connections have the same voltage potential.

Figure 7:
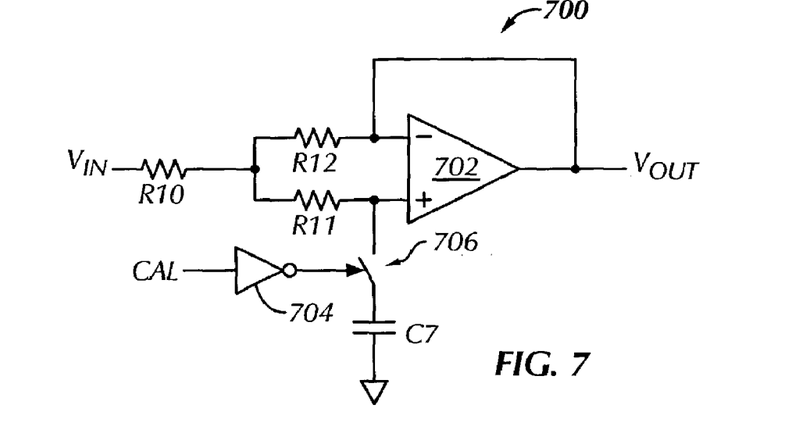
FIG. 7 shows a schematic diagram of an electrical signal filter circuit in accordance with an embodiment of the present invention.

FIG. 7 shows a schematic diagram of an electrical signal filter circuit (700) in accordance with an embodiment of the present invention. The electrical signal filter circuit (700) may have an output of a capacitor multiplier circuit connected to a following high impedance circuit. Accordingly, simulations and actual circuit realizations show that under realistic conditions, the output signal at VOUT, connected of the output of an amplifier circuit (702), has the most accurate and least distorted output of the connections listed above. Furthermore, the output signal at VOUT connected of the output of an amplifier circuit (702) has a lower impedance output. The capacitor C7 is operatively connected between an input of the amplifier circuit (702) and a reference voltage potential, for example, a ground voltage potential.

The amplifier circuit (702) is arranged as a unity gain amplifier circuit. The electrical signal filter circuit (700) uses a switch (706) to selectively disconnect the capacitor C7 from the amplifier circuit (702). The switch (706) may be user controlled and is connected to a calibration signal CAL through an inverter (704). When the calibration signal CAL is at, for example, a low voltage potential, the switch (706) is closed. Accordingly, the electrical signal filter circuit (700) operates normally. When the calibration signal CAL is at, for example, a high voltage potential, the switch (706) is open, and the electrical signal filter circuit (700) may be calibrated.

Figure 8:
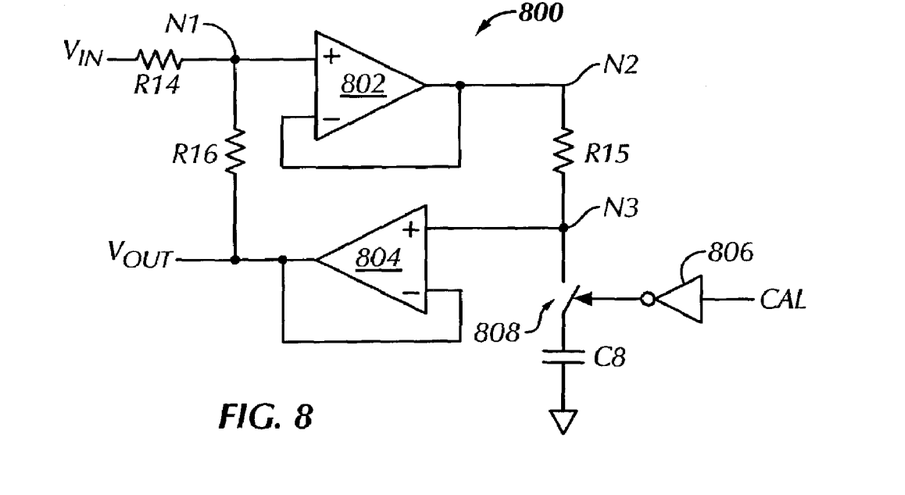
FIG. 8 shows a schematic diagram of an electrical signal filter circuit using a plurality of differential amplifier circuits in accordance with an embodiment of the present invention.

FIG. 8 shows a schematic diagram of an electrical signal filter circuit (800) using a plurality of differential amplifier circuits as part of a capacitor multiplier circuit in accordance with an embodiment of the present invention. The electrical signal filter circuit (800) includes two differential amplifier circuits (802, 804) arranged as unity gain amplifier circuits. The differential amplifier circuit (802) is used to scale the current from node N2 to node N3 across resistor R15. The differential amplifier circuit (804) is used to copy the capacitor voltage at node N3 to a signal at VOUT.

A base time constant for the capacitor multiplier circuit is determined by R15 and C8, and the scaling is determined by R14/R16. Alternate values of R15 provide alternate break frequencies. An output signal can be taken from any node except VIN, but a signal obtained from a direct connection to an output of the differential amplifier circuit (804) (i.e., VOUT) is preferred. A direct connection to the output of the differential amplifier circuit (804) provides a more accurate and less distorted output signal. Furthermore, because the scaling resistors (R14, R16) are electrically isolated from the time constant, the scaling resistors (R14, R16) may be small. The capacitor C8 is operatively connected between an input of the differential amplifier circuit (804) and a reference voltage potential, for example, a ground voltage potential.

The electrical signal filter circuit (800) uses a switch (808) to selectively disconnect the capacitor C8 from the capacitance multiplication circuit. The switch (808) may be user controlled and is connected to a calibration signal CAL through an inverter (806). When the calibration signal CAL is at, for example, a low voltage potential, the switch (808) is closed. Accordingly, the electrical signal filter circuit (800) operates normally. When the calibration signal CAL is at, for example, a high voltage potential, the switch (808) is open, and the electrical signal filter circuit (800) may be calibrated.

Figure 9:
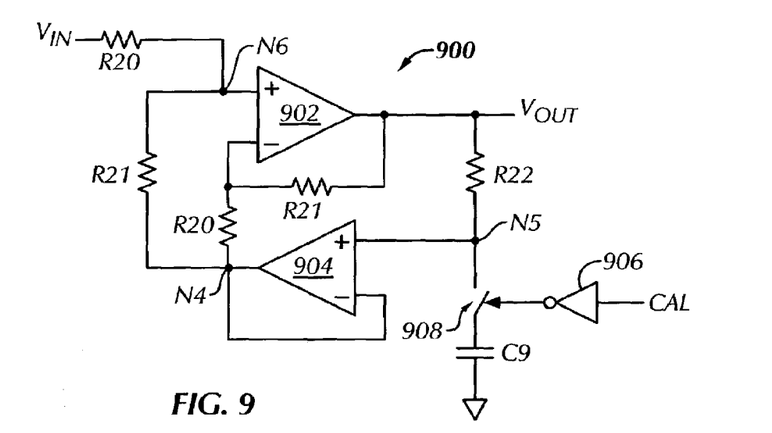
FIG. 9 shows a schematic diagram of an electrical signal filter circuit using a plurality of differential amplifier circuits in accordance with an embodiment of the present invention.

FIG. 9 shows a schematic diagram of an electrical signal filter circuit (900) using a plurality of differential amplifier circuits as part of a capacitor multiplier circuit in accordance with an embodiment of the present invention. The electrical signal filter circuit (900) includes two differential amplifier circuits (902, 904). Differential amplifier circuit (904) is arranged as unity gain amplifier circuit. The differential amplifier circuit (902) is used to scale the current from a signal at VOUT to node N5 across resistor R22. The differential amplifier circuit (904) is used to copy the capacitor voltage at node N5 to node N4.

A base time constant for the capacitor multiplier circuit is determined by R22 and C9, and the scaling is determined by R20/R21. Alternate values of R22 provide alternate break frequencies. An output signal can be taken from any node except VIN, but a signal obtained from a direct connection to an output of differential amplifier circuit (902) (i.e., VOUT) is preferred. Because the scaling resistors (R20, R21) are electrically isolated from the time constant, the scaling resistors (R20, R21) may be small. The capacitor C9 is operatively connected between an input of the differential amplifier circuit (904) and a reference voltage potential, for example, a ground voltage potential.

The electrical signal filter circuit (900) uses a switch (908) to selectively disconnect the capacitor C9 from the capacitance multiplication circuit. The switch (908) may be user controlled and is connected to a calibration signal CAL through an inverter (906). When the calibration signal CAL is at, for example, a low voltage potential, the switch (908) is closed. Accordingly, the electrical signal filter circuit (900) operates normally. When the calibration signal CAL is at, for example, a high voltage potential, the switch (908) is open, and the electrical signal filter circuit (900) may be calibrated.

Figure 10:
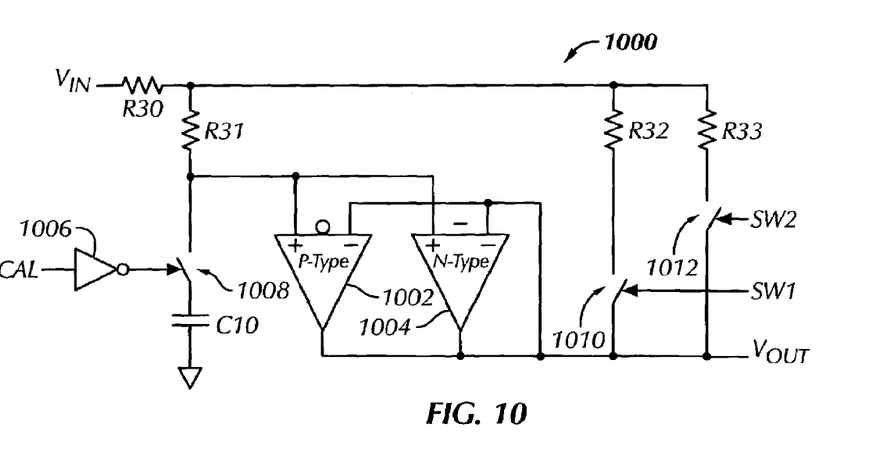
FIG. 10 shows a schematic diagram of an electrical signal filter circuit using p-type and n-type differential amplifier circuits in accordance with an embodiment of the present invention.

FIG. 10 shows a schematic diagram of an electrical signal filter circuit (1000) using a p-type differential amplifier circuit (1002) and an n-type differential amplifier circuit (1004) as part of a capacitor multiplier circuit in accordance with an embodiment of the present invention. The capacitor multiplier circuit is arranged to provide a means for configuring a cutoff frequency of the electrical signal filter (1000). The capacitor C10 is operatively connected between an input of both the p-type differential amplifier circuit (1002) and the n-type differential amplifier circuit (1004) and a reference voltage potential, for example, a ground voltage potential.

Selectively switching different values for C10, R30, and R31 may be used; however, the values for C10, R30, and R31 may be selected based on other design criteria. Accordingly, resistor R32 and resistor R33 (and additional resistors (not shown)) may be selectively switched to adjust the a cutoff frequency of the electrical signal filter (1000), and more specifically, the capacitor multiplier circuit. By selectively switching resistors (R32, R33), the lowest multiplier ratio (e.g., R31/(R32 and/or R33)) may be obtained for each desired cutoff frequency. One of ordinary skill in the art, having benefit of this disclosure, will understand that extensions to a larger numbers of selectable frequencies and optimization of the use of resistors may be designed without departing from the scope of the present invention.

Advantages of the present invention may include one or more of the following. In one or more embodiments, by using both a p-type differential amplifier circuit and an n-type differential amplifier circuit in a capacitor multiplier circuit, some common mode voltage potential range may be lost on one end of the range compared to solely using the p-type differential amplifier circuit or the n-type differential amplifier circuit. However, the other end of the common mode voltage potential range gains an equivalent amount lost from the original end of the range. Accordingly, a more symmetrical characteristic in the common mode voltage potential range is obtained. Furthermore, correction of the common mode voltage potential range may be obtained by, for example, adjusting a scaling factor.

In one or more embodiments, because both a p-type differential amplifier circuit and an n-type differential amplifier circuit are used in a capacitor multiplier circuit, the capacitor multiplier circuit avoids becoming locked in a non-performing state.

In one or more embodiments, because both a p-type differential amplifier circuit and an n-type differential amplifier circuit are used in a capacitor multiplier circuit, the capacitor multiplier circuit does not introduce a non-linearity in a middle voltage potential of a full voltage potential range.

In one or more embodiments, because scaling resistors are electrically isolated from a time constant, the scaling resistors may be advantageously small both in physical size and value.

In one or more embodiments, at least one capacitor is disconnected from a capacitor multiplier circuit. The disconnection provides a means to reduce a time required to calibrate the capacitor multiplier circuit and recover from the calibration.

In one or more embodiments, because an output signal line is directly connected to an output of an amplifier circuit in a capacitor multiplier circuit, a output signal from the capacitor multiplier circuit is more accurate and less distorted.

In one or more embodiments, a capacitor multiplier circuit provides an effective capacitance value that is larger than a value of an physical capacitor used in the capacitor multiplier circuit. The capacitor multiplier circuit is advantageously used in an electrical signal filter circuit that may be arranged as an RC filter circuit.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An electrical signal filter circuit, comprising:
   an input signal line;
   an output signal line;
   a first resistor operatively connected to the input signal line;
   a first node operatively connected to the first resistor such that the first resistor is operatively connected between the input signal line and the first node;
   a capacitor multiplier circuit operatively connected to the first node, wherein the capacitor multiplier circuit comprises at least one amplifier circuit and at least one capacitor, wherein the at least one amplifier circuit comprises a negative input, a positive input and an output, wherein the first node is operatively connected to the positive input of the at least one amplifier circuit of the capacitor multiplier circuit, and wherein the capacitor multiplier circuit increases a capacitance of the output signal line;
   a second resistor operatively connected to the output signal line;
   a second node operatively connected to the second resistor such that the second resistor is operatively connected between the output signal line and the second node and wherein the second node is also operatively connected to the negative input and the output of the at least one amplifier circuit; and
   an on-off switch operatively connected to capacitor and selectively connected to the first node.

2. An electrical signal filter circuit, comprising:
   an input signal line;
   an output signal line;
   a capacitor multiplier circuit wherein the capacitor multiplier circuit comprises at least one amplifier circuit and at least one capacitor, wherein the at least one amplifier circuit comprises a negative input, a positive input and an output, wherein the output signal line is operatively connected to an the negative input and output of the at least one amplifier circuit, and wherein the input signal line is operatively connected to the positive input of the at least one amplifier circuit; and
   an on-off switch operatively connected to the at least one capacitor and selectively connected to the input signal line.

3. An electrical signal filter circuit, comprising:
   an input signal line;
   an output signal line;
   a resistor operatively connected to the input signal line;
   a node operatively connected to the resistor such that the resistor is operatively connected between the input signal line and the node;
   a capacitor multiplier circuit, wherein the capacitor multiplier circuit is operatively connected to the node and the output signal line, wherein the capacitor multiplier circuit comprises a first differential amplifier circuit operatively connected to the node, a second differential amplifier circuit operatively connected to the first differential amplifier circuit, and at least one capacitor operatively connected to at least one input terminal selected from the first differential amplifier circuit and the second differential amplifier circuit;
   a reference voltage potential operatively connected to the at least one capacitor such that the at least one capacitor is operatively connected between the reference voltage potential and the at least one input terminal selected from the first differential amplifier circuit and the second differential amplifier circuit; and
   a switch, wherein the switch selectively disconnects the at least one capacitor from the at least one input terminal.

4. The electrical signal filter circuit of claim 3, wherein the first switch is operatively connected to a calibration signal line.

5. The electrical signal filter circuit of claim 4, wherein the first switch is user controlled.

6. The electrical signal filter circuit of claim 2, further comprising:
   a second switch, wherein the second switch selectively adjusts a cutoff frequency of the electrical signal filter circuit.

7. The electrical signal filter circuit of claim 6, wherein the second switch is user controlled.

8. A method for filtering an electrical signal, comprising the steps of:
   inputting the electrical signal;
   filtering the electrical signal, wherein the filtering step uses a capacitor multiplier circuit, wherein the capacitor multiplier circuit comprises at least one amplifier circuit and at least one capacitor, wherein the at least one amplifier circuit comprises two inputs and an output, and wherein the electrical signal enters through one of the two inputs;
   outputting a filtered electrical signal, wherein the outputting step results directly from the output of the at least one amplifier circuit; and
   calibrating an offset voltage potential of the filtered electrical signal from the outputting step by selectively disconnecting the at least one capacitor from the electrical signal.

9. A method for filtering an electrical signal, comprising the steps of:
   inputting the electrical signal;
   filtering the electrical signal, wherein the filtering step uses a capacitor multiplier circuit, and wherein the capacitor multiplier circuit comprises at least one amplifier circuit and at least one capacitor, wherein the at least one amplifier circuit comprises two inputs and an output, and wherein the electrical signal enters through one of the two inputs;
   outputting a filtered electrical signal, wherein the outputting step results directly from the output of the at least one amplifier circuit; and
   selectively adjusting a cutoff frequency of the filtered electrical signal from the outputting step.

10. The electrical signal filter circuit of claim 2, wherein the at least one amplifier circuit comprises at least one p-type differential amplifier circuit and at least one n-type differential amplifier circuit.

11. An electrical signal filter circuit, comprising:

means for inputting an electrical signal;

means for filtering the electrical signal operatively connected to the means for inputting, wherein the means for filtering uses a capacitor multiplier circuit, wherein the capacitor multiplier circuit comprises at least one amplifier circuit and at least one capacitor, and wherein the at least one amplifier circuit comprises a positive input and an output;

means for outputting a filtered electrical signal operatively connected to the means for filtering, wherein the means for outputting results directly from the output of the at least one amplifier circuit; and means for calibrating an offset voltage potential of the means for filtering wherein the means for calibrating is selectively connected to the positive input of the at least one amplifier circuit.

* * * * *